United States Patent
Seng

(10) Patent No.: US 7,276,790 B2
(45) Date of Patent: Oct. 2, 2007

(54) METHODS OF FORMING A MULTI-CHIP MODULE HAVING DISCRETE SPACERS

(75) Inventor: Eric Tan Swee Seng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 10/923,450

(22) Filed: Aug. 19, 2004

(65) Prior Publication Data

US 2006/0022323 A1     Feb. 2, 2006

(30) Foreign Application Priority Data

Jul. 29, 2004   (SG)   ............... 200404317-1

(51) Int. Cl.
*H01L 23/34* (2006.01)
(52) U.S. Cl. ..................... 257/724; 257/725
(58) Field of Classification Search ............... 257/686, 257/725, 777, 779, 780, 784, 724, 778; 438/107, 438/109
See application file for complete search history.

(56) References Cited

U.S. PATENT DOCUMENTS

| 5,323,060 | A | 6/1994 | Fogal et al. |
| RE36,613 | E | 3/2000 | Ball |
| 6,051,886 | A | 4/2000 | Fogal et al. |
| 6,189,208 | B1 * | 2/2001 | Estes et al. ............ 29/840 |
| 6,212,767 | B1 | 4/2001 | Tandy |
| 6,452,807 | B1 * | 9/2002 | Barrett ............ 361/767 |
| 6,472,758 | B1 | 10/2002 | Glenn et al. |
| 6,531,784 | B1 * | 3/2003 | Shim et al. ............ 257/777 |
| 6,569,709 | B2 * | 5/2003 | Derderian ............ 438/109 |
| 6,943,450 | B2 | 9/2005 | Fee et al. |
| 6,951,982 | B2 | 10/2005 | Chye et al. |
| 6,975,035 | B2 * | 12/2005 | Lee ............ 257/778 |
| 6,982,191 | B2 * | 1/2006 | Larson ............ 438/118 |
| 2002/0011676 | A1 * | 1/2002 | Akram et al. ............ 257/777 |
| 2002/0142513 | A1 | 10/2002 | Fee et al. |
| 2003/0002814 | A1 * | 1/2003 | Dudoff et al. ............ 385/78 |
| 2003/0038357 | A1 * | 2/2003 | Derderian |
| 2003/0042581 | A1 | 3/2003 | Fee et al. |
| 2003/0069654 | A1 * | 4/2003 | Larson ............ 700/86 |
| 2004/0169292 | A1 * | 9/2004 | James et al. ............ 257/786 |
| 2004/0217459 | A1 | 11/2004 | Fee et al. |
| 2005/0046000 | A1 | 3/2005 | Seng et al. |
| 2005/0064696 | A1 * | 3/2005 | Larson ............ 438/615 |

(Continued)

FOREIGN PATENT DOCUMENTS

EP    0 489 643 B1    3/1995

*Primary Examiner*—Thao P. Le
(74) *Attorney, Agent, or Firm*—TraskBritt, PC

(57) ABSTRACT

An assembly method that includes providing a first semiconductor device and positioning a second semiconductor device at least partially over the first semiconductor device is disclosed. Spacers space the active surface of the first semiconductor device substantially a predetermined distance apart from the back side of the second semiconductor device. Discrete conductive elements are extended between the active surface of the first semiconductor device and the substrate prior to positioning of the second semiconductor device. Intermediate portions of the discrete conductive elements pass through an aperture formed between the active surface of the first semiconductor chip, the back side of the second semiconductor chip, and two of the spacers positioned therebetween. Assemblies and packaged semiconductor devices that are formed in accordance with the method are also disclosed.

20 Claims, 8 Drawing Sheets

U.S. PATENT DOCUMENTS

2005/0093174 A1    5/2005   Seng
2005/0173807 A1*   8/2005   Zhu et al. .................. 257/777
2005/0282313 A1*  12/2005   Akram et al. .............. 438/108
2006/0017177 A1    1/2006   Seng et al.
2006/0035503 A1    2/2006   Seng et al.
2006/0201704 A1*   9/2006   Heng et al. ................ 174/260

* cited by examiner

METHODS OF FORMING A MULTI-CHIP MODULE HAVING DISCRETE SPACERS

CROSS-REFERENCE TO RELATED APPLICATION

This application claims the benefit of Singapore Patent Application No. 200404317-1, filed Jul. 29, 2004, the contents of which are hereby incorporated herein by reference in their entirety.

BACKGROUND OF THE INVENTION

1. Field of the Invention

The present invention relates generally to semiconductor device assemblies, or so-called "multi-chip modules," and, more specifically, to multi-chip modules in which two or more semiconductor devices are stacked relative to one another. In particular, the present invention relates to stacked semiconductor device assemblies in which the distances between adjacent, stacked semiconductor devices are determined, at least in part, by a plurality of discrete spacers interposed therebetween, and discrete conductive elements protrude from a central region of the lower semiconductor device and pass through a common aperture formed between the active surface of the lower semiconductor device, the back side of the upper semiconductor device and two of the spacers.

2. Background of Related Art

In order to conserve the amount of surface area, or "real estate," consumed on a carrier substrate, such as a circuit board, by semiconductor devices connected thereto, various types of increased density packages have been developed. Among these various types of packages is the so-called "multi-chip module" (MCM). Some types of multi-chip modules include assemblies of semiconductor devices that are stacked one on top of another. The amount of surface area on a carrier substrate that may be saved by stacking semiconductor devices is readily apparent—a stack of semiconductor devices consumes roughly the same amount of real estate on a carrier substrate as a single, horizontally oriented semiconductor device or semiconductor device package.

Due to the disparity in processes that are used to form different types of semiconductor devices (e.g., the number and order of various process steps), the incorporation of different types of functionality into a single semiconductor device has proven very difficult to actually reduce to practice. Even in cases where semiconductor devices that carry out multiple functions can be fabricated, multi-chip modules that include semiconductor devices with differing functions (e.g., memory, processing capabilities, etc.) are often much more desirable since the separate semiconductor devices may be fabricated independently and later assembled with one another much more quickly and cost-effectively (e.g., lower production costs due to higher volumes and lower failure rates).

Multi-chip modules may also contain a number of semiconductor devices that perform the same function, effectively combining the functionality of all of the semiconductor devices thereof into a single package.

An example of a conventional, stacked multi-chip module includes a carrier substrate, a first, larger semiconductor device secured to the carrier substrate, and a second, smaller semiconductor device positioned over and secured to the first semiconductor device. The second semiconductor device does not overlie bond pads of the first semiconductor device and, thus, the second semiconductor device does not cover bond wires that electrically connect bond pads of the first semiconductor device to corresponding contacts or terminals of the carrier substrate. As the bond pads of each lower semiconductor device are not covered by the next higher semiconductor device, vertical spacing between the semiconductor devices is not required. Thus, any suitable adhesive may be used to secure the semiconductor devices to one another. Such a multi-chip module is disclosed and illustrated in U.S. Pat. No. 6,212,767, issued to Tandy on Apr. 10, 2001 (hereinafter "the '767 Patent"). Notably, since the sizes of the semiconductor devices of such a multi-chip module must continue to decrease as they are positioned increasingly higher in the stack, the obtainable heights of such multi-chip modules and the number of semiconductor devices that may be placed therein is severely limited.

Another example of a conventional multi-chip module is described in U.S. Pat. No. 5,323,060, issued to Fogal et al. on Jun. 21, 1994 (hereinafter "the '060 Patent"). The multi-chip module of the '060 Patent includes a carrier substrate with semiconductor devices disposed thereon in a stacked arrangement. The individual semiconductor devices of each multi-chip module may be the same size or different sizes, with upper semiconductor devices being either smaller or larger than underlying semiconductor devices. Adjacent semiconductor devices of each of the multi-chip modules disclosed in the '060 Patent are secured to one another with an adhesive layer. The thickness of each adhesive layer well exceeds the loop heights of wire bonds protruding from a semiconductor device upon which that adhesive layer is to be positioned. Accordingly, the presence of each adhesive layer prevents the back side of an overlying, upper semiconductor device from contacting bond wires that protrude from an immediately underlying, lower semiconductor device of the multi-chip module. The adhesive layers of the multi-chip modules disclosed in the '060 Patent do not encapsulate or otherwise cover any portion of the bond wires that protrude from any of the lower semiconductor devices. It does not appear that the inventors named on the '060 Patent were concerned with overall stack heights. Thus, the multi-chip modules of the '060 Patent may be undesirably thick due to the use of thick spacers or adhesive structures between each adjacent pair of semiconductor devices, resulting in wasted adhesive and excessive stack height.

A similar but more compact multi-chip module is disclosed in U.S. Pat. No. Re. 36,613, issued to Ball on Mar. 14, 2000 (hereinafter "the '613 Patent"). The multi-chip module of the '613 Patent includes many of the same features as those disclosed in the '060 Patent, including adhesive layers of carefully controlled thicknesses that space vertically adjacent semiconductor devices apart a greater distance than the loop heights of wire bonds protruding from the lower of the adjacent dice. The use of thinner bond wires with low-loop profile wire bonding techniques permits adjacent semiconductor devices of the multi-chip module disclosed in the '060 Patent to be positioned more closely to one another than adjacent semiconductor devices of the multi-chip modules disclosed in the '060 Patent. Nonetheless, an undesirably large amount of additional space may remain between the tops of the bond wires protruding from one semiconductor device and the back side of the next higher semiconductor device of such a stacked multi-chip module.

The vertical distance that adjacent semiconductor devices of a stacked type multi-chip module are spaced apart from one another may be reduced by arranging the immediately underlying semiconductor devices, such that upper semiconductor devices are not positioned over bond pads of immediately lower semiconductor devices or bond wires protruding therefrom. Thus, adjacent semiconductor devices may be spaced apart from one another a distance that is about the same as or less than the loop heights of the wire bonds that protrude above the active surface of the lower semiconductor device. U.S. Pat. No. 6,051,886, issued to Fogal et al. on Apr. 18, 2000 (hereinafter "the '886 Patent"), discloses such a multi-chip module. According to the '886 Patent, wire bonding is not conducted until all of the semiconductor devices of such a multi-chip module have been assembled with one another and with the underlying carrier substrate. The semiconductor devices of the multi-chip modules disclosed in the '886 Patent must have bond pads that are arranged on opposite peripheral edges. Semiconductor devices with bond pads positioned adjacent the entire peripheries thereof could not be used in the multi-chip modules of the '886 Patent. This is a particularly undesirable limitation due to the ever-increasing feature density of state-of-the-art semiconductor devices, which is often accompanied by a subsequent need for an ever-increasing number of bond pads on semiconductor devices.

Conventionally, when a particular amount of spacing is needed between semiconductor devices to separate discrete conductive elements, such as bond wires, that protrude above an active surface of one semiconductor device from the back side of the next higher semiconductor device, the semiconductor devices of stacked multi-chip modules have been separated from one another with preformed spacers. Exemplary spacers that have been used in stacked semiconductor device arrangements have been formed from dielectric-coated silicon (which may be cut from scrapped dice) or a polyimide film. An adhesive material typically secures such a spacer between adjacent semiconductor devices. The use of such preformed spacers is somewhat undesirable since an additional alignment and assembly step is required for each such spacers. If silicon spacers are employed, an adhesive must be applied to both surfaces thereof, and prior passivation of the spacer surfaces may be required to prevent shorting between two adjacent devices. Proper alignment of a preformed spacer with a semiconductor device requires that a spacer not be positioned over bond pads of the semiconductor device.

Another example of a conventional MCM is disclosed in U.S. Pat. No. 6,569,709 to Derderian (hereinafter "the '709 Patent"), the disclosure of which is incorporated in its entirety by reference herein. More specifically, the '709 Patent discloses, as shown in FIG. 1 hereof, a conventional assembly 10 including a substrate 20 with two semiconductor devices 30A, 30B (collectively referred to as "semiconductor devices 30") positioned thereover in stacked arrangement.

The depicted substrate 20 of the '709 Patent is an interposer with a number of bond pads, which are referred to herein as contact areas 24, through which electrical signals are input to or output from semiconductor devices 30 carried upon a surface 22 of substrate 20. Each contact area 24 corresponds to a bond pad 34 on an active surface 32 of one of the semiconductor devices 30 positioned upon substrate 20.

A first semiconductor device 30A is secured to substrate 20. Peripherally located bond pads 34 of first semiconductor device 30A communicate with corresponding contact areas 24 of substrate 20 by way of discrete conductive elements 38A. A second semiconductor device 30B is positioned over, or "stacked," on first semiconductor device 30A. A back side 35 of second semiconductor device 30B is electrically isolated from discrete conductive elements 38A. Second semiconductor device 30B is secured to first semiconductor device 30A by way of an adhesive element 36 interposed between and secured to active surface 32 of first semiconductor device 30A and back side 35 of second semiconductor device 30B. The adhesive element 36 may comprise a thermoplastic resin, a thermoset resin, or an epoxy. The MCM is conventionally covered with a protective encapsulant. Since conventional multi-chip modules may be affixed to one another with a continuous adhesive element with mechanical properties e.g., modulus of elasticity, coefficient of thermal expansion (CTE), etc., which do not precisely correspond to the mechanical properties of the semiconductor devices or encapsulant materials, stresses, such as thermal stresses, may develop between the semiconductor devices. CTE mismatch between the adhesive element and encapsulant material can lead to delamination of components of the assembly and, specifically, of delamination along the interface between a transfer molded encapsulant of the assembly and the mass, or "pillow," of adhesive element 36.

A further conventional MCM configuration is disclosed in U.S. Pat. No. 6,531,784 to Shim et al. Particularly, in the disclosed "stacked-die" embodiment, a second die has been mounted on top of the first die with elongated spacer strips. Conductive wires are bonded to corresponding terminal pads on the first die, channeled through a corresponding groove in a corresponding spacer strip, then bonded to a corresponding one of the terminal pads on the substrate. The spacer strips serve to captivate the bonding wires and keep them separated from one another and the surfaces of the dice. The elongated shape of the spacer strip increases the surface area contact of the die and spacer, leading to problems from CTE mismatch.

In view of the foregoing, it appears that a method for forming stacked semiconductor device assemblies that reduces the likelihood of damage to semiconductor devices and associated wire bonds, as well as provides flexibility in bond pad number and placement on the semiconductor devices of the assembly, would be useful.

BRIEF SUMMARY OF THE INVENTION

The present invention, in a number of exemplary embodiments, includes semiconductor device assemblies, as well as a method for assembling semiconductor devices in a stacked arrangement.

In one aspect of the present invention, a semiconductor device assembly includes a first semiconductor device with a plurality of spacers arranged over an active surface thereof, a second semiconductor device positioned at least partially over the first semiconductor device, and discrete conductive elements protruding over at least a portion of the active surface, and extending through at least one common aperture formed between the spacers, the active surface of the first semiconductor die, and the back side of the second semiconductor device. The spacers are of a height that spaces the first and second semiconductor devices apart from one another by a distance substantially the same as a predetermined distance that maintains electrical isolation between the discrete conductive elements protruding over the active surface of the first semiconductor device and the back side of the second semiconductor device while minimizing the height of the assembly.

The semiconductor device assembly may also include a substrate, such as a circuit board, an interposer, another semiconductor device, or leads, that includes contact areas to which bond pads of at least the first, lowermost, semiconductor device are electrically connected.

The discrete conductive elements that protrude above the active surface of the first semiconductor device may be electrically connected to corresponding contact areas of a substrate, such as a circuit board, an interposer, another semiconductor device, or leads. Alternatively, the discrete conductive elements may themselves comprise leads e.g., in a leads-over-chip (LOC) type arrangement with the first semiconductor device.

Portions, or all, of the semiconductor device assembly may be encapsulated. For example, the first and second semiconductor devices, as well as portions of a substrate, if any, that are located adjacent to the first semiconductor device and discrete conductive elements extending between those portions of a substrate and the first and second semiconductor devices, may be partially or fully covered with an encapsulant.

One embodiment of a method for forming an assembly according to the present invention includes providing a first semiconductor device, applying or forming spacers to protrude at least partially over an active surface thereof, and positioning a second semiconductor device over the spacers. Alternatively, the spacers may be applied to or formed on a back side of the second semiconductor device before placing the second semiconductor device over the first semiconductor device.

Various types of materials, including, without limitation, epoxies, silicones, silicone-carbon resins, polyimides, and polyurethanes, may be used to form the spacers. Spacers may comprise an adhesive tape that may be cut to a desired segment shape and adhered to the semiconductor die. In a further alternative, spacers may be formed upon the semiconductor die by stereolithography or photolithography techniques as known in the art.

The height of the spacers is selected to space the first and second semiconductor devices a distance substantially the same as a predetermined distance apart from one another. The spacers are configured to support the second semiconductor device positioned thereon while maintaining electrical isolation between the back side of the second semiconductor device and the discrete conductive elements that protrude over the active surface of the first semiconductor device.

Prior to placement of the second semiconductor device, discrete conductive elements, for example, wire bonds, are placed or formed between the bond pads of the first semiconductor device and corresponding contact areas of the substrate. Intermediate portions of the discrete conductive elements pass through an aperture formed between the active surface of the first semiconductor chip, the back side of the second semiconductor chip, and two of the spacers. The discrete conductive elements may be electrically connected to corresponding contact areas of a substrate, such as a circuit board, an interposer, another semiconductor device, or leads. Alternatively, the discrete conductive elements may themselves comprise leads e.g., in a leads-over-chip (LOC) type arrangement with the first semiconductor device.

In the event that the height of the spacers will cause the back side of the second semiconductor device to rest upon discrete conductive elements protruding above the active surface of the first semiconductor device, it is preferred that the back side of the second semiconductor device and the discrete conductive elements be electrically isolated from one another, for example, by way of a dielectric (e.g., polymer material, oxide, nitride, etc.) coating on at least portions of the back side of the second semiconductor device that contact discrete conductive elements, a dielectric coating on at least portions of the discrete conductive elements that contact the back side, or some combination thereof.

Of course, assemblies incorporating teachings of the present invention may include more than two semiconductor devices in a stacked arrangement.

Once the semiconductor devices of such an assembly have been assembled with one another and electrically connected with a substrate or with one another, the assembly may be packaged by encapsulation as known in the art using, for example, transfer molding, injection molding, pot molding or stereolithographic techniques.

Other features and advantages of the present invention will become apparent to those of skill in the art through consideration of the ensuing description, the accompanying drawings, and the appended claims.

DETAILED DESCRIPTION OF THE INVENTION

Generally, the present invention contemplates that spacers may be disposed between adjacent semiconductor devices comprising an MCM. Further, the active surfaces of both of the adjacent semiconductor devices may be oriented in substantially the same direction. Also, the semiconductor device having an active surface directly facing a back side of the adjacent semiconductor device may include centrally located bond pads that are wire bonded to a substrate. Such a configuration may provide an MCM with improved flexibility and reliability. As used herein, the term "semiconductor device" includes, for example, a semiconductor die of silicon, gallium arsenide, indium phosphide or other semiconductive material configured as a processor, logic, memory or other function, wherein integrated circuitry is fabricated on an active surface of the die while part of a wafer or other bulk semiconductor substrate that is later "singulated" to form a plurality of individual semiconductor dice.

Figure 1:
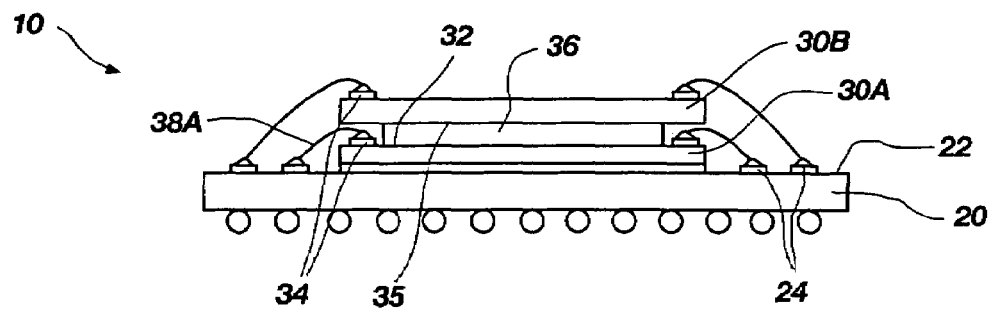
FIG. 1 is a cross-sectional view of a schematic representation of a conventional semiconductor die assembly.
Figure 2A:
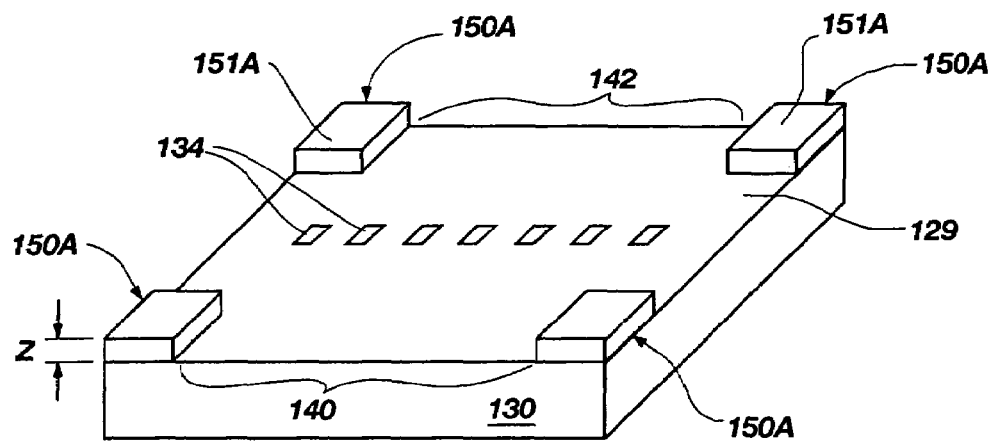
FIG. 2A is a perspective assembly view of one embodiment of an assembly of the present invention.

In one exemplary embodiment of the present invention, FIG. 2A shows a perspective view of a semiconductor device 130 having bond pads 134 and generally rectangular spacers 150A disposed proximate the four corners of semiconductor device 130 on the active surface 129 thereof. Spacers 150A may each include an upper surface 151A, which are configured for abutting against the back side of another semiconductor device superimposed over semiconductor device 130.

Spacers 150A may comprise a tape having an adhesive layer on each side thereof, which may be cut to a desired segment shape and adhered to the active surface 129 of semiconductor device 130. Alternatively, spacers 150A may be formed by depositing a hardenable or curable paste or gel of dielectric material upon the active surface 129 using a dispensing nozzle or a stencil. In a further alternative, spacers 150A may be formed upon the active surface 129 of semiconductor device 130 by stereolithography or photolithography techniques as known in the art. In stereolithographic techniques suitable for such an application, a liquid UV-wavelength light sensitive polymer, also known as a photoimageable material, on the active surface is selectively cured by exposure to a laser beam of appropriate wavelength at desired spacer locations, the process being repeated for higher spacers to provide multilayer structures. The spacers 150A may thus be formed from photoimageable material, and may be formed as at least two superimposed, contiguous, mutually adhered layers of material. Such an operation may be desirably performed at the wafer level, prior to die singulation. Photolithographic techniques involve, for example, application of a layer of dielectric material such as a polyimide to the active surface of a wafer (by, for example, spraying or spin-coating), followed by masking with a photoresist, selective exposure of the photoresist to protect the dielectric material at the spacer location, and subsequent etching of the dielectric material at unprotected locations. Alternatively, photolithography may be used to form spacers from photoresist material itself at desired locations by application of the photoresist followed by selective exposure through a mask.

Semiconductor device 130 may comprise any one of various known types of semiconductor devices, including memories (such as DRAMs, SRAMs, flash memories, EPROMs, EEPROMs, etc.), microprocessors, application specific integrated circuits (ASICs), digital signal processors (DSPs) and the like.

Side region 140 of semiconductor device 130 may be sized and configured to encompass the lateral extent of the area on which bond pads 134 are positioned. Put another way, bond pads 134 may lie in an area bounded by the innermost corners, in relation to the center of semiconductor device 130, of each of spacers 150A. As shown in FIG. 2A, bond pads 134 may be arranged and oriented in a single, linear row along an axis located generally through the center of the semiconductor device 130. However, it is understood that the present invention may be implemented using a semiconductor chip having bond pads that are configured in a variety of patterns and having any number of bond pads 134, such as the bond pads 134" in FIG. 2C, which are shown in a parallel, centrally located double-row formation or, alternatively, as shown in FIG. 2B, which shows a semiconductor device 130' including both central and peripheral bond pads 134'.

Spacers 150A may have a height, "Z," which is configured for allowing wire bonds (not shown) to extend, for example, from bond pads 134 toward either of side regions 140 and 142 but without exceeding the height "Z." Such a configuration may allow for placement of another semiconductor die (not shown), adjacent and superimposed above active surface 129 of semiconductor device 130 without contacting wire bonds (not shown) which may extend from centrally located bond pads 134 toward either of side regions 140 or 142.

Figure 2B:
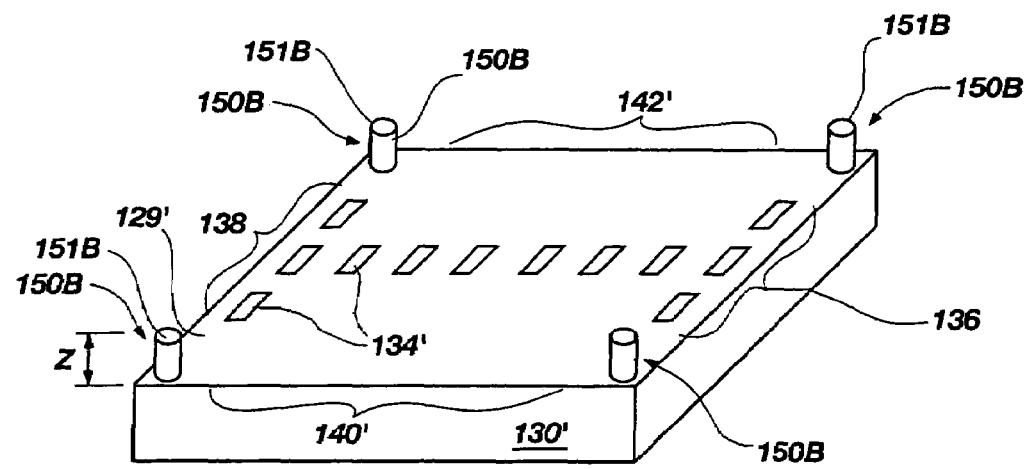
FIG. 2B is a perspective assembly view of another embodiment of an assembly of the present invention.

In another exemplary embodiment according to the present invention depicted in FIG. 2B, semiconductor device 130' may comprise bond pads 134' and substantially cylindrical spacers 150B disposed proximate the four corners of semiconductor device 130' on the active surface 129' thereof. Spacers 150B may each include an upper surface 151B, which are configured for abutting against the back side of another semiconductor device superimposed over semiconductor device 130'.

As shown in FIG. 2B, bond pads 134' may be arranged and oriented in a single, linear row along an axis located generally through the center of the semiconductor device 130' as well as along the periphery of semiconductor device 130' adjacent both side regions 138 and 136 of semiconductor device 130'. Accordingly, side region 140' between spacers 150B from the active surface 129 of semiconductor device 130' to height "Z" of spacers 150B may be sized and configured for passing discrete conductive elements in the form of wire bonds (not shown) extending from at least one of bond pads 134' to a position exceeding the periphery of the semiconductor device 130'. Similarly, side region 142' between spacers 150B from the active surface 129' of semiconductor device 130' to height "Z" of spacers 150B may be sized and configured for passing wire bonds (not shown) extending from at least one of bond pads 134' to a position exceeding the periphery of the semiconductor device 130'. Further, side region 138 between spacers 150B from the active surface 129' of semiconductor device 130' to height "Z" of spacers 150B may be sized and configured for passing wire bonds (not shown) extending from at least one of bond pads 134' to a position exceeding the periphery of the semiconductor device 130'. Also, side region 136 between spacers 150B from the active surface 129' of semiconductor device 130' to height "Z" of spacers 150B may be sized and configured for passing wire bonds (not shown) extending from at least one of bond pads 134' to a position exceeding the periphery of the semiconductor device 130'. As explained in more detail hereinbelow, wire bonds may extend to a common substrate that is sized and configured for electrical connection of the MCM to other devices.

Figure 2C:
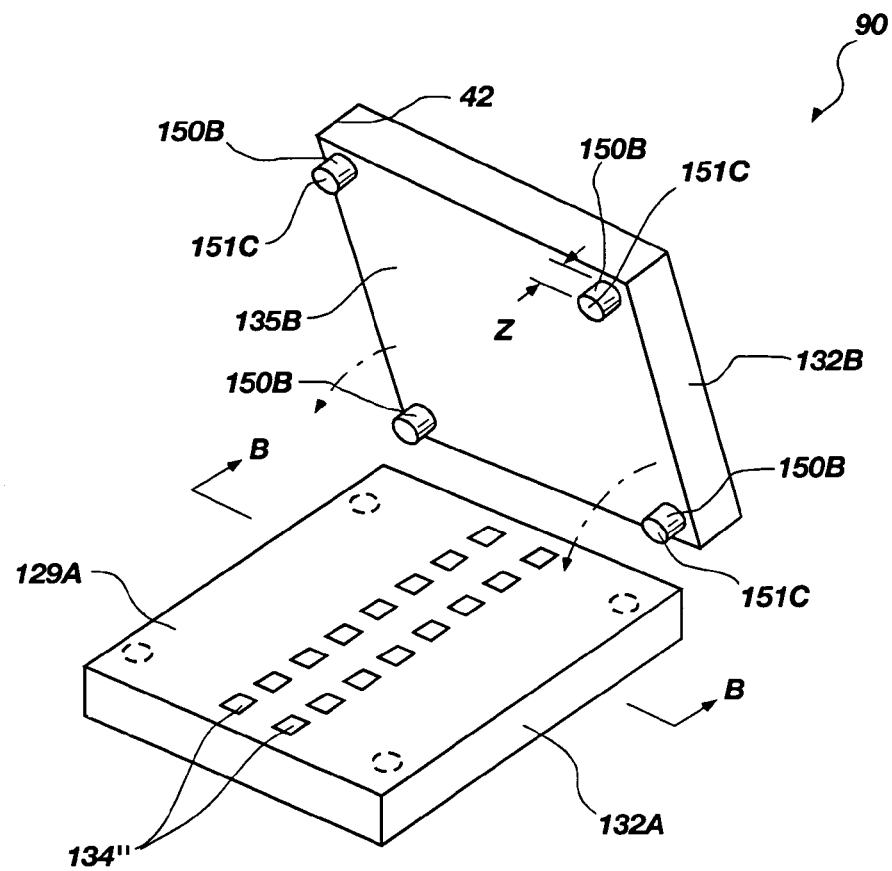
FIG. 2C is a perspective assembly view of another embodiment of an assembly of the present invention.

FIG. 2C shows an exploded view of a semiconductor device assembly 90 including a first semiconductor device 132A and a second semiconductor device 132B, which are configured to be superimposed adjacent one another and affixed to one another to form an MCM according to the present invention. However, as shown in FIG. 2C, substantially cylindrical spacers 150B are disposed on the back side 135B of second semiconductor device 132B. Spacers 150B may include a lower surface 151C, which are configured for abutting against the active surface 129A of first semiconductor device 132A. Thus, spacers may be applied to or formed on the active surface of the first semiconductor die, on the back side of the second semiconductor die, or at least one spacer may be applied to or formed on both the active surface of the first semiconductor die and on the back side of the second semiconductor die, without limitation.

Figure 2D:
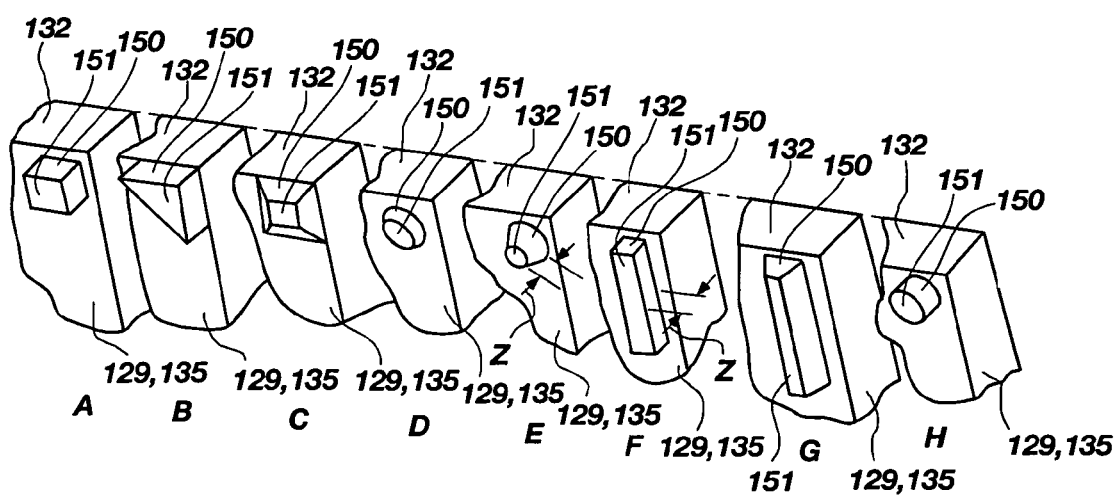
FIGS. 2D(A)-2D(H) are partial perspective views of semiconductor dice having differently configured spacers secured to a surface thereof.

The present invention contemplates that there are many geometric configurations for spacers 150. For instance, although spacers 150B are depicted in FIG. 2C and in FIG. 2D(H) as having a substantially cylindrical shape, more generally, spacers 150 may alternatively be configured as pillars having a rectangular cross-section FIG. 2D(A), pillars of triangular cross-section FIG. 2D(B), truncated pyramids FIG. 2D(C), truncated cones FIG. 2D(D), truncated curved cones FIG. 2D(E), elongated strips FIGS. 2D(F) and 2D(G) and cylindrical cross-section FIG. 2D(H). As shown in FIG. 2D(A-H), spacers 150 may include a surface 151 for matingly engaging an active surface or back side of another semiconductor device (not shown). Spacers 150 alternatively may be formed by dispensing dots. The surface 151 of spacers 150 formed by dispensing dots may be rounded or include a projecting tail. Spacers 150 may be positioned on an active surface 129 of semiconductor device 132 or a back side 135 thereof, without limitation.

Figure 2E:
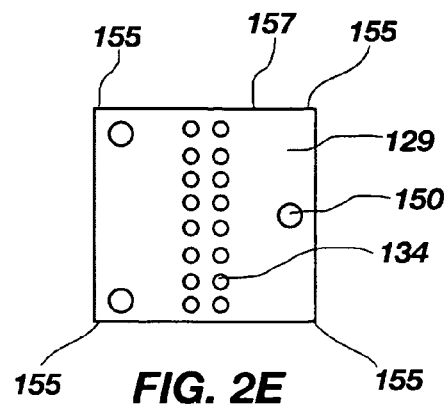
FIGS. 2E-2L are plan views of semiconductor dice having spacers secured to the surfaces thereof in different locations.
Figure 2I:
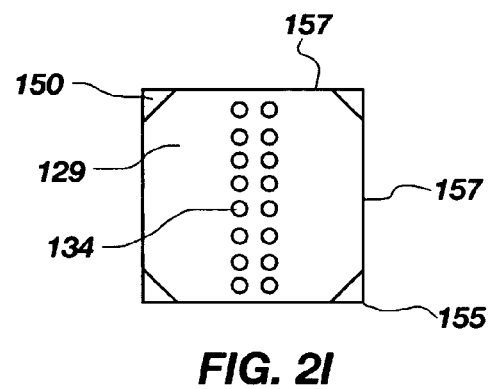
Figure 2F:
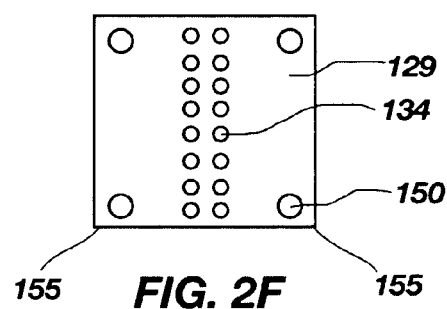
Figure 2J:
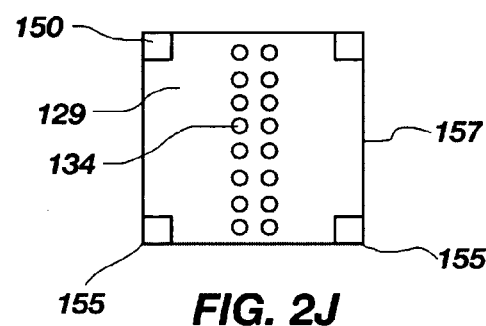
Figure 2G:
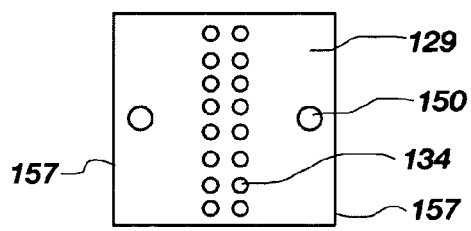
Figure 2K:
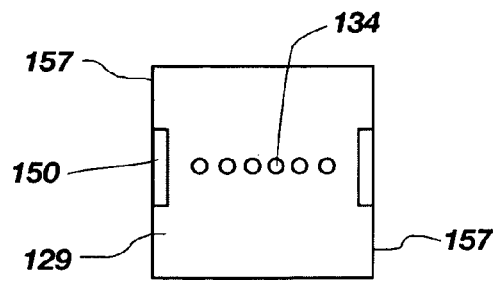
Figure 2H:
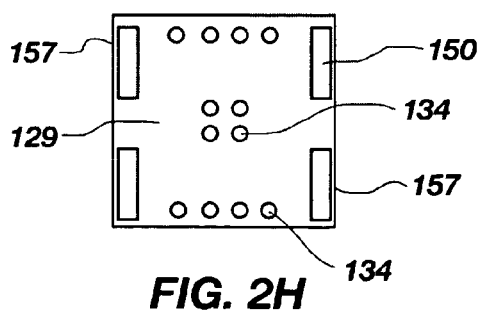
Figure 2L:
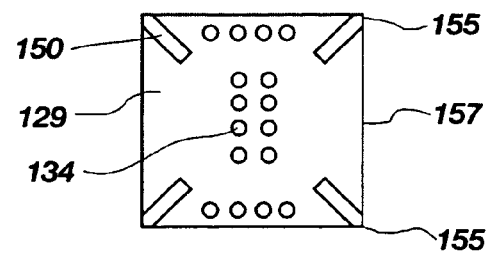

Furthermore, the present invention also contemplates a multitude of bond pad and spacer arrangements. By the way of example, and not to limit the scope of the present invention, FIGS.2E-L illustrate various exemplary arrangements of spacers 150 on the active surface 129 of a semiconductor device in relation to bond pads 134. In FIG. 2E, two substantially cylindrical spacers 150 are located near adjacent corners 155, and a third spacer 150 is located between corners 155 on the opposite peripheral edge 157 of the semiconductor device. In FIG. 2F, a spacer 150 is located near each of the four corners 155 of active surface 129. Only two cylindrical spacers 150 are used in the embodiment of FIG.2G, each spacer 150 being positioned adjacent opposite peripheral edges 157 of the semiconductor device on opposite peripheral edges 157 of the centrally located rows of bond pads 134. Of course, the diameter of the cylinders may be greater than the lateral dimensions of spaces of other arrangements, to provide adequate stability for the upper semiconductor device. FIGS. 2I and 2J illustrate the use of spacers 150 with generally triangular and generally square cross-sections, respectively, positioned at corners 155 of active surface 129. In FIG. 2H, four elongated spacers 150 are shown, two spacers 150 each being located adjacent to a portion of and parallel with one peripheral edge 157 of the semiconductor device and the other two spacers 150 being similarly located adjacent to the opposite peripheral edge 157 of the semiconductor device. FIGS. 2K and 2L illustrate other orientations of elongated spacers 150. In FIG. 2K, the two elongated spacers 150 are positioned adjacent and parallel to opposite peripheral edges 157 of the semiconductor device. The four elongated spacers 150 depicted in FIG. 2L are positioned to extend from a location adjacent corners 155 diagonally toward the center of active surface 129 of the semiconductor device. Although the spacers 150 shown in FIGS. 2E-2L are shown as being positioned on the active surface 129 of a lower semiconductor device, the present invention also contemplates that spacers 150 may be positioned on the back side of an upper semiconductor device, as shown in FIG. 2C.

Thus, it may be appreciated that the bond pads on the active surface of the semiconductor device may be configured in relationship to the size and position of the spacers, as illustrated by FIGS. 2E-2L for providing sufficient accessibility to those bond pads positioned centrally. In more detail, at least one of the side regions of a multi-chip module, assuming the disposition of two semiconductor devices superimposed with respect to one another and separated by spacers positioned therebetween, may be sized for providing a common aperture, respectively, for ingress and egress of discrete conductive elements for electrical connection to other electrical components, such as, for instance, the connection pads of an interposer. Specifically, at least one common aperture along a peripheral edge or side region may be sized and configured for accommodating a plurality of wire bonds extending therethrough and, optionally to the connection pads of an interposer.

Figure 8A:
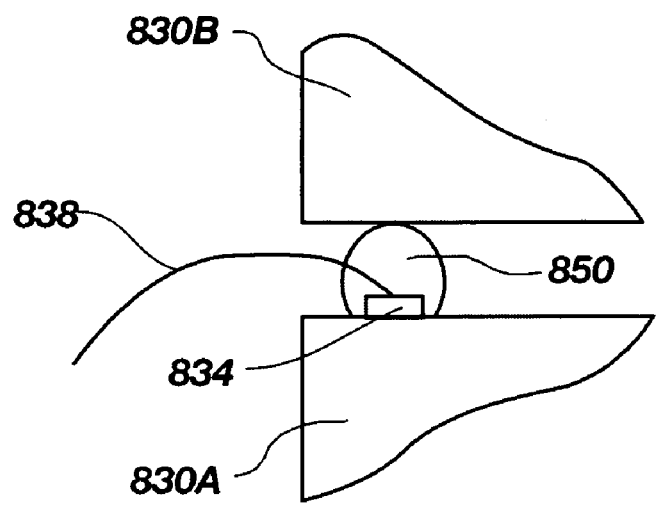
FIG. 8A is a schematic representation of a portion of another embodiment of a semiconductor assembly of the present invention.
Figure 8B:
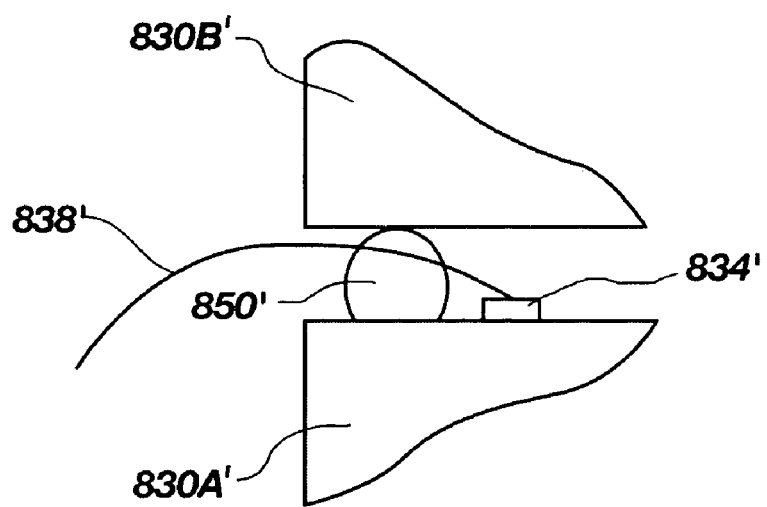
FIG. 8B is a schematic representation of a portion of yet another embodiment of a semiconductor assembly of the present invention.

Although the spacers 150 shown in FIGS. 2E-2L are shown as being positioned on the active surface 129 of a semiconductor device for providing an aperture for ingress and egress of discrete conductive elements, the present invention also contemplates, as shown in FIG. 8A, that spacers 850 may be formed over the discrete conductive elements 838 following electrical connection. Spacers 850 may be positioned over bond pads 834 of first semiconductor device 830A, and second semiconductor device 830B is positioned over the first semiconductor device 830A in relation thereto by spacers 850. Alternatively, as shown in FIG. 8B, second semiconductor device 830B' may be positioned in relation to first semiconductor device 830A' by spacers 850'. Spacers 850' may be formed over the discrete conductive elements 838' and positioned adjacent bond pads 834' of first semiconductor device 830A'.

As described hereinabove, the present invention may provide relatively great flexibility in the arrangement of the bond pads of a semiconductor device over which another semiconductor die is superimposed. Another aspect of a multi-chip module arrangement of the present invention may be particularly desirable, as discussed below.

A multi-chip module according to the present invention may develop thermal stresses of lower magnitudes because direct affixation between stacked semiconductor dice may be limited to the mechanical coupling due to the interposed spacers. Since conventional multi-chip modules may be affixed to one another with a continuous layer of adhesive with mechanical properties (e.g., modulus of elasticity, coefficient of thermal expansion, etc.) that do not precisely correspond to the mechanical properties of the semiconductor devices, stresses, such as thermal stresses, may develop between the semiconductor devices. It should be noted that the present invention does not preclude the use of additional structure to affix the stacked semiconductor devices, such as, for example, introduction of a dielectric underfill layer therebetween. In such an instance, the spaced relationship of the stacked semiconductor devices and the open spaces between the spacers at the periphery of the assembly provides more than adequate space to accommodate expansion or contraction of the interposed dielectric material while it is curing or otherwise hardening.

Turning now to FIGS. 3A-3E, an exemplary method for fabricating assembly 110 is illustrated.

Figure 3A:
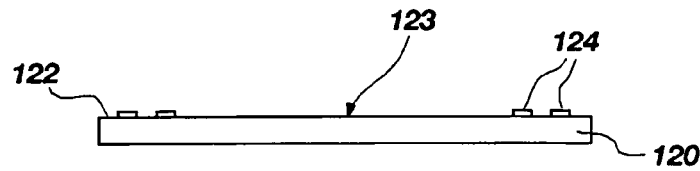
FIGS. 3A-3E are schematic representations depicting fabrication of the assembly depicted in FIG. 3F.

As shown in FIG. 3A, a substrate 120, in this case an interposer, is provided. Of course, the use of other types of substrates, such as circuit boards, semiconductor devices, leads, and the like, in assemblies and assembly methods incorporating teachings of the present invention are also within the scope of the present invention. Accordingly, substrate 120 may be formed from silicon, glass, ceramic, an organic material (e.g., FR-4 or FR-5 resin laminate), metal (e.g., copper, aluminum, etc.), or any other suitable material. Contact areas 124, shown in the form of bond pads, are arranged on surface 122 of substrate 120 adjacent to a semiconductor device supporting region 123 of surface 122.

Figure 3B:
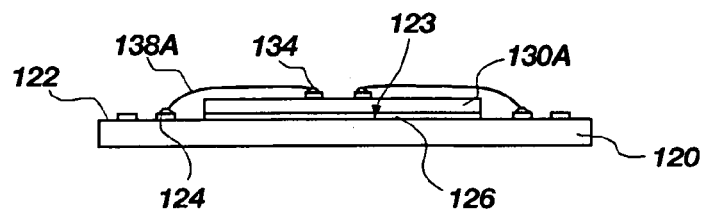

Next, as shown in FIG. 3B, first semiconductor device 130A is positioned on and secured to supporting region 123 of surface 122 by way of first adhesive element 126. By way of example, first adhesive element 126 may comprise an adhesive-coated structure, such as a polyimide film, or a quantity of adhesive material (e.g., thermoset resin, thermoplastic resin, epoxy, etc.). Discrete conductive elements 138A, depicted as bond wires in FIG. 3B, are formed or placed as well known in the art using a wire bond capillary between bond pads 134 of first semiconductor device 130A and their corresponding contact areas 124 of substrate 120.

Figure 3C:
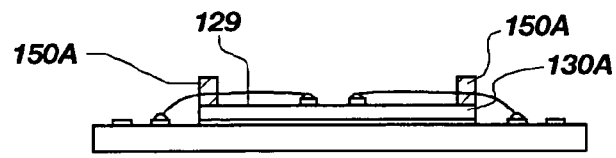

FIG. 3C illustrates that two or more spacers 150A may then be positioned upon the active surface 129 of the first semiconductor device 130A. For instance, a volume of adhesive may be applied in a predetermined volume to form a spacer 150A, the adhesive at least partially unconsolidated (e.g., liquid, paste, gel, etc.) on active surface 129 of first semiconductor device 130A. Upon curing, the predetermined quantity of adhesive material may cause a subsequently positioned second semiconductor device 130B (FIG. 3D) to be spaced a distance substantially the same as a predetermined distance apart from first semiconductor device 130A. However, the second semiconductor device 130B may be positioned over the first semiconductor device 130A prior to curing of the adhesive material if the adhesive material in an uncured state provides adequate mechanical support and, therefore, curing of the adhesive material may be used to affix the first semiconductor device 130A to the second semiconductor device 130B.

As may be appreciated, a suitable adhesive material may preferably have sufficient viscosity or surface tension to resist excessive spreading or flowing off of the active surface 129 of the first semiconductor device 130A. However, the viscosity of adhesive material may permit a quantity thereof to spread out somewhat when placed on active surface 129, but while remaining relatively thick. By way of example only, adhesive material may comprise an epoxy, a silicone, a silicone-carbon resin, a polyimide, an acrylate or a polyurethane. Some suitable dielectric adhesive materials are those available from Loctite/Henkel, formerly Dexter Corporation of Industry, California, and are known as QUANTUM die attach and thermal adhesives. Other suppliers of suitable dielectric adhesive materials include Ablestik, Hitachi, Sumitomo, and Advanced Applied Adhesive. A suitable polyimide is polyamideimide (PAI), marked under the trademark Torlon by Amoco Corporation. Another suitable polyimide is Bismaleimide (BMI).

Alternatively, a so-called double-sided tape comprising a dielectric film having an adhesive applied to each side thereof may be employed to form spacers 150A. For instance, discrete pieces of double-sided tape may be placed upon the active surface 129 of first semiconductor device 130A. The thickness "Z" of the double-sided tape may be selected so that the back side of the second semiconductor device 130B will not contact the discrete conductive elements 138A. Such a configuration may reduce or prevent electrical shorting of the discrete conductive elements 138A with one another or with the back side of the second semiconductor device 130B.

It should also be appreciated that spacers 150A may be formed on the active surface 129 of first semiconductor device 130A prior to formation of discrete conductive elements 138A. Thus, the size and position of spacers 150A may be selected so as to not interfere with formation of discrete conductive elements 138A. For instance, the size and position of spacers 150A may be selected so as to not interfere with a wire bond capillary as employed in a wire bonding process. Such a process sequence may reduce manufacturing cycle times by enabling simultaneous formation of spacers on a number of semiconductor devices (for example, by stereolithography, photolithography, stenciling, etc., while the semiconductor devices are still at the wafer level. In addition, as illustrated in FIG. 2C, alternatively, spacers may be disposed on the back side of the second semiconductor device 130B.

Figure 3D:
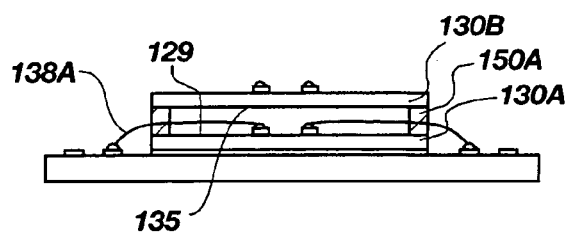

As depicted in FIG. 3D, second semiconductor device 130B may be aligned with and positioned over first semiconductor device 130A in a substantially parallel, planar relationship thereto and placed upon spacers 150A. For instance, a pick and place device may be used to align, position and place second semiconductor device 130B upon spacers 150A. The second semiconductor device 130B may be substantially the same size as the first semiconductor device 130A resulting in a same/similar size die stack as depicted in FIG. 3D.

Alternatively, the second semiconductor device 130B may be smaller than the first semiconductor device 130A, resulting in a pyramid die stack. Additionally, it will be appreciated that an inverted pyramid stack may be formed, the second semiconductor device 130B being larger than the first semiconductor device 130A.

Optionally, prior to assembly of second semiconductor device 130B with first semiconductor device 130A, discrete conductive elements 138A may be at least partially insulated with a dielectric coating. Such coating may be effected by dispensing a low viscosity dielectric material over discrete conductive elements 138A, by forming a dielectric coating thereover using stereolithography, or by other suitable techniques. At least partially encapsulating or insulating discrete conductive elements 138A, particularly the portions thereof proximate to the back side of second semiconductor device 130B, may inhibit or prevent electrical shorting or other undesirable electrical communications.

More generally, back side 135 of second semiconductor device 130B may be electrically isolated from discrete conductive elements 138A that extend above the active surface 129 of first semiconductor device 130A by being spaced apart therefrom, by dielectric coating on at least contacting portions of one or both of discrete conductive elements 138A and back side 135, or by any combination of spacing and dielectric coating(s). A dielectric coating may be easily formed on the back side 135 using, for example, spin coating of a polyimide, oxidation or nitridation of the semiconductor material of the back side 135, application of an adhesive-coated dielectric film, or other known technique.

First semiconductor device 130A and second semiconductor device 130B are substantially spaced a set distance apart from one another, which set distance may or may not be equal to the predetermined distance, depending upon whether or not spacers 150A expand or contract upon curing or hardening. Of course, thermoplastic adhesive materials may harden upon cooling, while other types of adhesive materials may be cured in a manner that depends upon the type of curable adhesive material employed and result in at least somewhat resilient structures. By way of example only, snap curing processes, heat curing processes, chemical (in situ) curing, UV curing processes, microwave curing processes, or any suitable combination thereof (e.g., UV curing an exposed, outer portion of adhesive material, then heat curing the interior portions thereof) may be used to cure a spacer 150A comprising a curable adhesive material to at least a semisolid state.

Figure 3E:
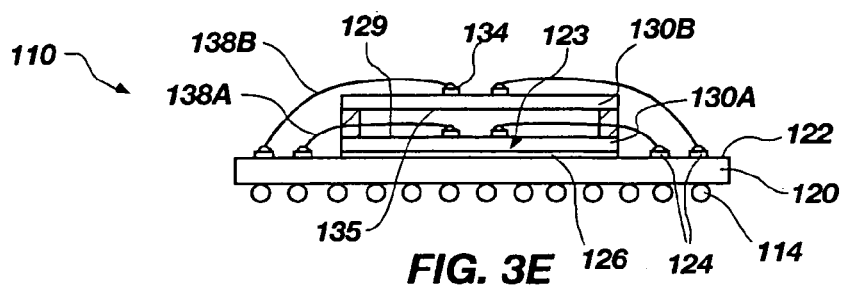

Next, as shown in FIG. 3E, discrete conductive elements 138B, again wire bonds by way of example, may be positioned between bond pads 134 of second semiconductor device 130B and corresponding contact areas 124 of substrate 120 to electrically connect bond pads 134 and contact areas 124.

Figure 3F:
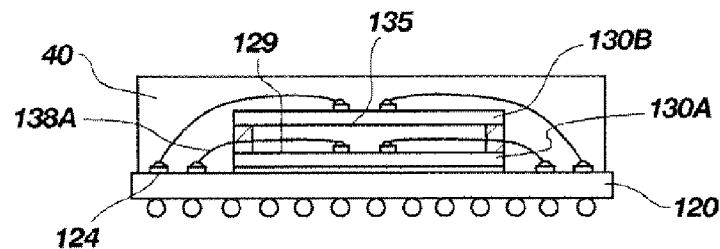
FIG. 3F is a schematic representation of one embodiment of an assembly incorporating teachings of the present invention.

Once bond pads 134 of second semiconductor device 130B are in communication with their corresponding contact areas 124 of substrate 120, a protective encapsulant 40 may be placed over all or part of substrate 120, first semiconductor device 130A, and/or second semiconductor device 130B. FIG. 3F shows a protective encapsulant 40 over part of substrate 120, first semiconductor device 130A, and second semiconductor device 130B. By way of example only, protective encapsulant 40 may comprise a pot or transfer molded package, as shown in FIG. 3F, a stereolithographically fabricated package, or a glob top type overcoat. As noted previously, a dielectric underfill material may be introduced between semiconductor devices 130A and 130B after assembly thereof. Of course, known materials and processes may be used to form protective encapsulant 40. In the molded package example, protective encapsulant 40 may be formed from a transfer molding compound (e.g., a two-part silicon particle-filled epoxy) using known transfer molding processes, which may employ thermoset resins or thermoplastic polymers, or pot-molded using a thermosetting resin or an epoxy compound. In the stereolithography example, protective encapsulant 40 may comprise a plurality of at least partially superimposed, contiguous, mutually adhered material layers. For example, each layer may be formed by selectively curing (e.g., with a UV laser) regions of a layer of photocurable (e.g., UV curable) material, as known in the stereolithography art. When protective encapsulant 40 is a glob top, suitable glob top materials (e.g., epoxy, silicone, silicone-carbon resin, polyimide, polyurethane, etc.) may be dispensed, as known in the art, to form protective encapsulant 40.

Protective encapsulant 40 may flow between first semiconductor device 130A and second semiconductor device 130B and around discrete conductive elements 138A. Such encapsulant disposed about discrete conductive elements 138A may electrically isolate discrete conductive elements 138A from back side 135 of second semiconductor device 130B.

An MCM assembly according to the present invention will next be described with continued reference to FIGS. 3E and 3F. The depicted substrate 120 is an interposer with a number of bond pads, which are referred to herein as contact areas 124, through which electrical signals are input to or output from semiconductor devices 130 carried upon or adjacent to a surface 122 of substrate 120. Each contact area 124 corresponds to a bond pad 134 on an active surface 129 of one of the semiconductor devices 130 positioned upon substrate 120.

As shown in FIG. 3E, a first semiconductor device 130A may be secured to substrate 120 by way of a first adhesive element 126, such as a quantity of an appropriate thermoset resin, a quantity of pressure sensitive adhesive, an adhesive-coated film or tape, or the like. Bond pads 134 of first semiconductor device 130A communicate with corresponding contact areas 124 of substrate 120 by way of discrete conductive elements 138A, such as the illustrated bond wires, tape-automated bond (TAB) elements comprising traces carried on a flexible dielectric film, other thermocompression bonded leads, and other known types of conductive elements. However, at least one of the bond pads 134 of the first semiconductor device 130A may be located centrally.

Second semiconductor device 130B may be positioned over, or "stacked" on, first semiconductor device 130A. A back side 135 of second semiconductor device 130B may be electrically isolated from discrete conductive elements 138A either by being spaced apart therefrom or by way of dielectric coatings on at least portions of discrete conductive elements 138A that may contact back side 135. Alternatively, back side 135 may include dielectric coatings on at least portions thereof that contact discrete conductive elements 138A. Second semiconductor device 130B may be secured to first semiconductor device 130A by way of spacers 150A interposed between and secured to active surface 129 of first semiconductor device 130A and back side 135 of second semiconductor device 130B. By way of example only, spacers 150A may comprise a thermoplastic resin, a thermoset resin, an epoxy, or any other suitable material that, upon at least partial curing, will adhere to and substantially maintain the desired relative positions of first and second semiconductor devices 130A, 130B.

Of course, optionally and as previously noted, the space between first semiconductor device 130A and second semiconductor device 130B may be underfilled, as known in the art. Known underfill materials (e.g., thermoset resins, two-stage epoxies, etc.) may be used. For example, liquid encapsulant material sold as WE707 by Kulicke & Soffa Industries of Willow Grove, Pa., and similar materials sold by Dexter Corporation as QMI 536 may be used.

Bond pads 134 of second semiconductor device 130B may be electrically connected to corresponding contact areas 124 of substrate 120 by way of discrete conductive elements 138B. Discrete conductive elements 138B may comprise the aforementioned bond wires, TAB elements, other thermocompression bonded leads, or any other known type of discrete conductive element for extending between and establishing the desired communication between a bond pad 134 and its corresponding contact area 124.

Assembly 110 may also include a plurality of discrete external connective elements 114 carried by substrate 120 and in electrical communication with contact areas 124 through vias (not shown) and traces (not shown) of substrate 120, such as the depicted solder balls, conductive pins, conductive lands or any other conductive structures that are suitable for interconnecting assembly 110 with other, external electronic components. Finally, assembly 110 may be encapsulated as depicted in FIG. 3F, using any suitable protective encapsulant 40.

Figure 4:
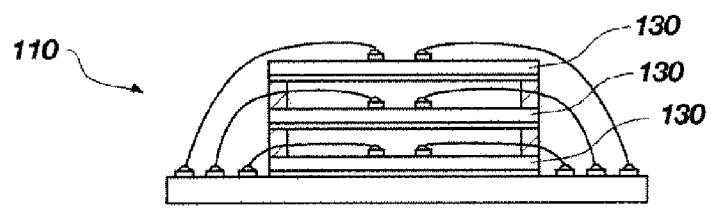
FIG. 4 is a cross-sectional representation of another embodiment of an assembly of the present invention.

In another aspect of the present invention, as illustrated in FIG. 4, an assembly 110 may include more than two semiconductor devices 130. Each additional semiconductor device 130 may be added to assembly 110 in a manner similar to that described in reference to FIGS. 3D-3E. It should also be appreciated that the present invention contemplates more than three semiconductor devices in a stacked arrangement.

In a further aspect of the present invention, by employing the spacers of the present invention, two or more side apertures formed between the opposing surfaces of stacked semiconductor devices may provide access to bond pads of one of the stacked semiconductor devices.

Figure 5:
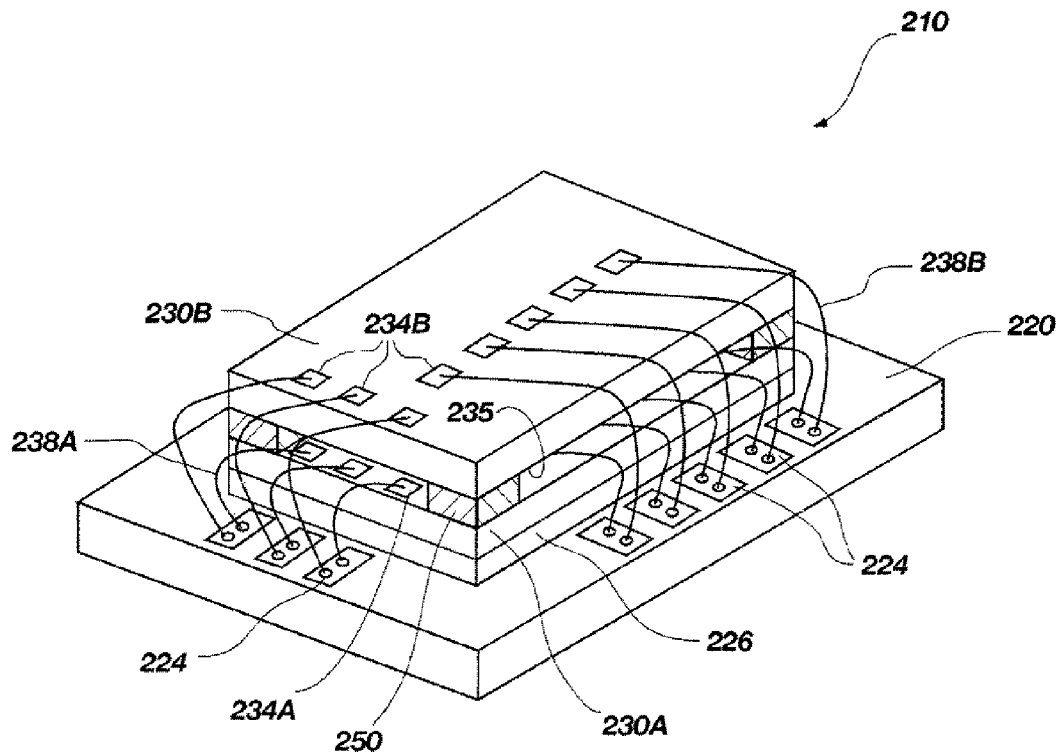
FIG. 5 is a perspective view of another embodiment of an assembly of the present invention.

For instance, FIG. 5 shows a perspective view of an assembly 210 according to the present invention wherein a first semiconductor device 230A may be secured to substrate 220 by way of a first adhesive element 226, such as a quantity of an appropriate thermoset resin, a quantity of pressure sensitive adhesive, an adhesive-coated film or tape, or the like. A second semiconductor device 230B, which may be substantially identical to first semiconductor device 230A, may be positioned over, or "stacked" on, first semiconductor device 230A. Discrete conductive elements 238A access bond pads 234A through the side apertures formed between the opposing surfaces of the semiconductor devices 230A, 230B.

Spacers 250 may be positioned proximate each corner of and between first semiconductor device 230A and second semiconductor device 230B. Spacers 250 may comprise a quantity of an appropriate thermoset resin, a quantity of pressure sensitive adhesive, an adhesive-coated film or tape, or the like. Accordingly, spacers 250 may position first semiconductor device 230A in relation to second semiconductor device 230B. Further, spacers 250 may affix first semiconductor device 230A to second semiconductor device 230B.

A back side 235 of second semiconductor device 230B may be electrically isolated from discrete conductive elements 238B either by being spaced apart therefrom or by way of dielectric coatings on at least portions of discrete conductive elements 238B that may potentially contact one another. Alternatively, back side 235 may include dielectric coatings on at least portions thereof that may potentially contact discrete conductive elements 238A.

As shown in FIG. 5, bond pads 234B of second semiconductor device 230B may be electrically connected to corresponding contact areas 224 of substrate 220 by way of discrete conductive elements 238B. Discrete conductive elements 238B may comprise the aforementioned bond wires, TAB elements, other thermocompression bonded leads, or any other known type of discrete conductive element for extending between and establishing the desired communication between a bond pad 234B and its corresponding contact area 224. The present invention may accommodate various bond pad configurations. As shown in FIG. 5, bond pads 234B comprise both centrally located bond pads 234B as well as peripherally located bond pads 234A.

Generally, the present invention contemplates that at least two discrete conductive elements may share a common aperture formed between two semiconductor devices. Discrete conductive elements 238A of first semiconductor device 230A may extend from bond pads 234A and through a common side aperture formed between discrete spacers 250, the active surface of the first semiconductor device 230A and the back side 235 of the second semiconductor device 230B for communication with corresponding contact areas 224 of substrate 220.

Thus, the present invention provides a configuration wherein conductive elements may extend from centrally positioned bond pads of a semiconductor device over which another semiconductor device is positioned through at least one common aperture formed between spacers, the active surface of the semiconductor die over which another semiconductor device is positioned, and the back side surface of the another semiconductor device. Alternatively, it may be advantageous to provide a plurality of peripheral or side apertures for the ingress and egress of discrete conductive elements, such as wire bonds.

Figure 6A:
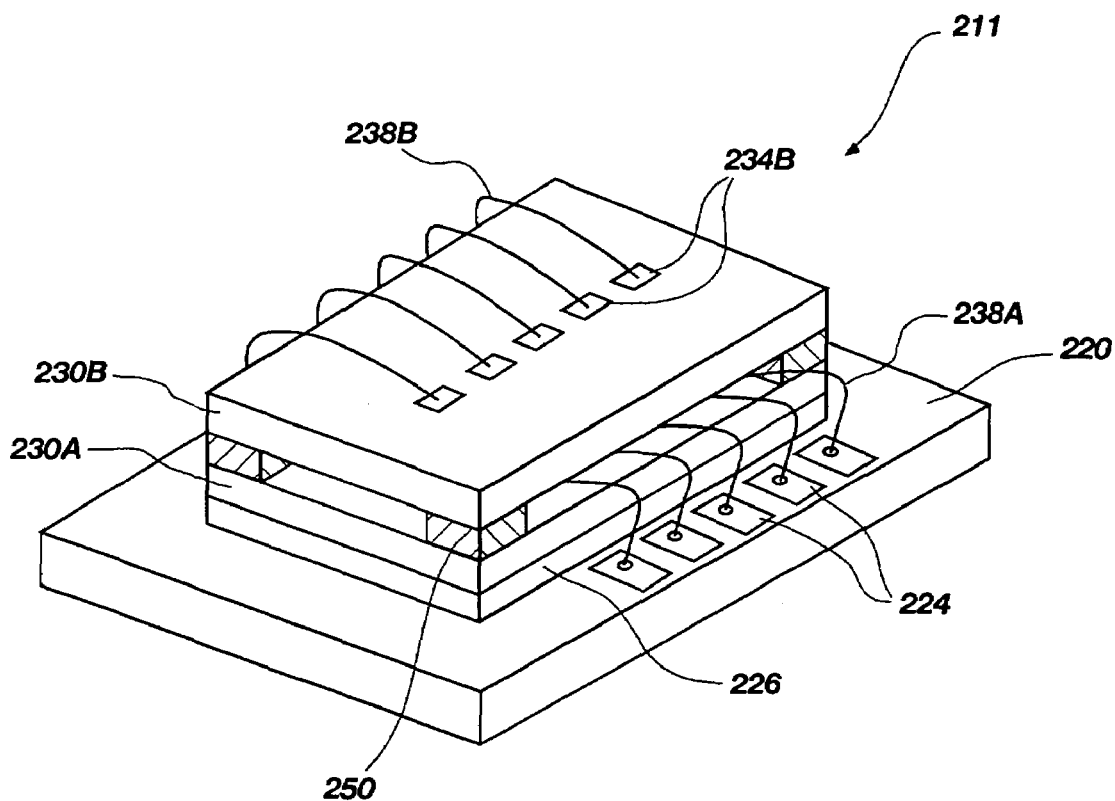
FIG. 6A is a perspective view of another embodiment of an assembly of the present invention.
Figure 6B:
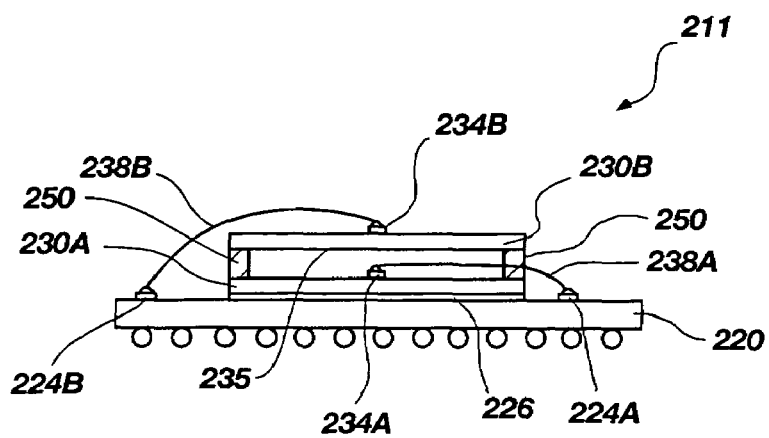
FIG. 6B is a cross-sectional representation of the assembly depicted in FIG. 6A.

For instance, FIGS. 6A and 6B show another embodiment of the invention, multi-chip module 211. Centrally located bond pads (not shown) on first semiconductor device 230A are electrically connected to corresponding contact areas 224A of substrate 220 by way of discrete conductive elements 238A. The discrete conductive elements 238A pass between spacers 250. A common aperture exists between spacers 250, the active surface of the first semiconductor device 230A, and the back side 235 of second semiconductor device 230B. Centrally located bond pads 234B of second semiconductor device 230B are electrically connected to corresponding contact areas 224B (FIG. 6B) of substrate 220 by way of discrete conductive elements 238B. Contact areas 224A and 224B are arranged on the substrate 220 adjacent opposing sides of first semiconductor device 230A, allowing electrical isolation between discrete conductive elements 238A and 238B.

Figure 7:
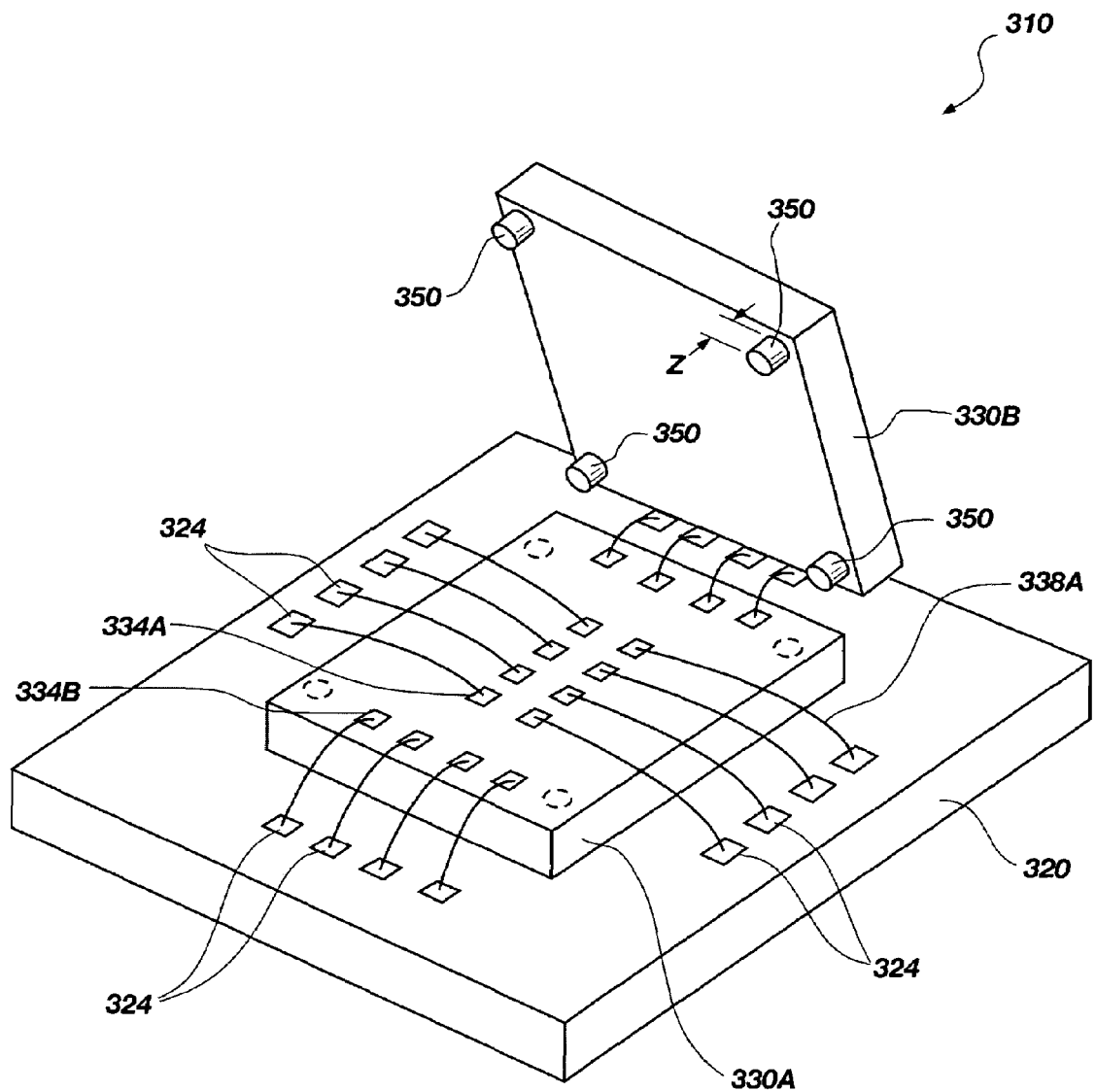
FIG. 7 is a perspective assembly view of yet another embodiment of an assembly of the present invention.

FIG. 7 depicts an exploded perspective view of another embodiment of the invention, multi-chip module 310. Multi-chip module 310 includes a first semiconductor device 330A affixed to substrate 320, and a second semiconductor device 330B. The second semiconductor device 330B is positioned over the first semiconductor device 330A and is positioned in relation thereto by spacers 350, which extend from the back side of second semiconductor device 330B to the active surface of the first semiconductor device 330A. Additionally, each peripheral region of a multi-chip module 310, as shown in FIG. 7, encompasses two or more discrete conductive elements 338A, which pass through the aperture formed between spacers 350, the active surface of the first semiconductor device 330A and the back side of second semiconductor device 330B. Moreover, the bond pads of the first semiconductor device 330A are arranged in both the central region and the peripheral region of the active surface of the first semiconductor device 330A. Contact areas 324 are arranged adjacent each side of first semiconductor device 330A. Centrally located bond pads 334A and peripheral bond pads 334B are electrically connected by way of discrete conductive elements 338A to corresponding contact areas 324 of substrate 320.

As will be appreciated by those of ordinary skill in the art, the present invention conserves material in comparison to adhesive "pillow" spacing techniques and avoids CTE mismatch problems associated with the interface between the adhesive and transfer mold compound along the interface therebetween, reduces the volume of material required as well as the number of process steps in comparison to the use of silicon or other preformed spacers requiring application of an adhesive thereto and provides an extremely flexible, simple yet robust packaging method and resulting end product.

Although the foregoing description contains many specifics, these should not be construed as limiting the scope of the present invention, but merely as providing illustrations of some exemplary embodiments. Similarly, other embodiments of the invention may be devised that do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for forming a multi-chip module, comprising:

providing a substrate including a plurality of contact areas on a surface thereof;

securing a first semiconductor device having an active surface including a plurality of bond pads and a back side by the back side to the substrate surface;

disposing a plurality of discrete spacers on the active surface of the first semiconductor device;

placing discrete conductive elements between the plurality of bond pads of the first semiconductor device and the plurality of contact areas of the substrate with intermediate portions of the discrete conductive elements passing over the active surface and through a space between two of the plurality of discrete spacers; and superimposing a second semiconductor device having a back side over the first semiconductor device, the back side of the second semiconductor device being separated from the active surface of the first semiconductor device by the plurality of discrete spacers.

2. The method of claim 1, wherein providing the substrate comprises providing one of a circuit board, an interposer, another semiconductor device, and leads.

3. The method of claim 1, wherein placing the discrete conductive elements between the plurality of bond pads of the first semiconductor device and the plurality of contact areas of the substrate comprises at least one of wire bonding the bond pads to the contact areas, tape-automated bonding the bond pads to the contact areas, and thermocompression bonding leads to the bond pads and to the contact areas.

4. The method of claim 1, wherein disposing the plurality of discrete spacers comprises forming at least one of the plurality of discrete spacers adjacent at least one corner of the active surface.

5. The method of claim 1, wherein disposing the plurality of discrete spacers comprises forming at least two of the plurality of discrete spacers adjacent opposite peripheral edges of the active surface.

6. The method of claim 1, wherein disposing the plurality of discrete spacers comprises providing at least selected discrete spacers of the plurality of discrete spacers to have a height that defines a substantially consistent distance between the active surface of the first semiconductor device and the back side of the second semiconductor device.

7. The method of claim 1, wherein disposing the plurality of discrete spacers comprises forming the plurality of discrete spacers from photoimageable material.

8. The method of claim 7, wherein forming the plurality of discrete spacers from photoimageable material comprises forming each of the plurality of discrete spacers as at least two superimposed, contiguous, mutually adhered layers of material.

9. The method of claim 1, wherein disposing the plurality of spacers comprises forming the plurality of spacers of at least one of an adhesive paste, a flowable adhesive, a thermoplastic material, a thermocurable material, and a dielectric material comprising a tape having an adhesive on each side thereof or a tape coated with thermoplastic material.

10. The method of claim 1, further comprising:
encapsulating at least portions of the first semiconductor device, the second semiconductor device, the discrete conductive elements, and the substrate.

11. The method of claim 10, wherein encapsulating comprises one of transfer molding, pot molding, and glob top encapsulation.

12. The method of claim 10, wherein encapsulating comprises forming a plurality of at least partially superimposed, contiguous, mutually adhered material layers.

13. The method of claim 12, further comprising forming the plurality of at least partially superimposed, contiguous, mutually adhered material layers from a photocurable material.

14. A method for forming a multi-chip module, comprising:
providing a substrate including a plurality of contact areas on a surface thereof;
securing a first semiconductor device, having a back side and an active surface including a plurality of bond pads, by the back side to the substrate surface;
disposing a plurality of discrete spacers on the active surface of the first semiconductor device;
placing discrete conductive elements conductively between the plurality of bond pads of the first semiconductor device and the plurality of contact areas of the substrate, intermediate portions of the discrete conductive elements passing over the active surface of the first semiconductor device and through a space formed by the active surface and between two of the plurality of discrete spacers; and
superimposing a second semiconductor device having a back side over the first semiconductor device, the back side of the second semiconductor device being separated from the active surface of the first semiconductor device by the plurality of discrete spacers.

15. The method of claim 14, wherein placing the discrete conductive elements conductively between the plurality of bond pads of the first semiconductor device and the plurality of contact areas of the substrate comprises at least one of tape-automated bonding the bond pads to the contact areas, and thermocompression bonding leads to the bond pads and to the contact areas.

16. The method of claim 14, wherein disposing the plurality of discrete spacers comprises providing at least selected discrete spacers of the plurality of discrete spacers to have a height that defines a substantially consistent distance between the active surface of the first semiconductor device and the back side of the second semiconductor device.

17. The method of claim 14, wherein disposing the plurality of discrete spacers comprises forming the plurality of discrete spacers from photoimageable material comprising at least two superimposed, contiguous, mutually adhered layers of material.

18. The method of claim 14, further comprising:
encapsulating at least portions of the first semiconductor device, the second semiconductor device, the discrete conductive elements, and the substrate, encapsulating comprises forming a plurality of at least partially superimposed, contiguous, mutually adhered material layers from a photocurable material.

19. A method for forming a multi-chip module, comprising:
providing a substrate including a plurality of contact areas on a surface thereof;
securing a first semiconductor device, having a back side and an active surface including a plurality of bond pads, by the back side to the substrate surface;
disposing a plurality of discrete spacers on the active surface of the first semiconductor device;
placing discrete conductive elements between the plurality of bond pads of the first semiconductor device and the plurality of contact areas of the substrate, the discrete conductive elements having intermediate portions passing over the active surface of the first semiconductor device and through a space between two of the plurality of discrete spacers; and
superimposing a second semiconductor device having a back side over the first semiconductor device, the back side of the second semiconductor device being separated from the active surface of the first semiconductor device by the plurality of discrete spacers.

20. The method of claim 14, further comprising:
encapsulating at least portions of the first semiconductor device, the second semiconductor device, the discrete conductive elements, and the substrate, encapsulating comprises forming a plurality of at least partially superimposed, contiguous, mutually adhered material layers from a photocurable material.

* * * * *